United States Patent
Wang et al.

(10) Patent No.: US 7,727,845 B2
(45) Date of Patent: Jun. 1, 2010

(54) ULTRA SHALLOW JUNCTION FORMATION BY SOLID PHASE DIFFUSION

(75) Inventors: Chih-Hao Wang, Hsinchu (TW); Yen-Ping Wang, Taipei (TW); Steve Ming Ting, Hsinchu (TW); Yi-Chun Huang, Pingjhen (TW)

(73) Assignee: Taiwan Semiconductor Manufacturing Co., Ltd., HsinChu (TW)

( * ) Notice: Subject to any disclaimer, the term of this patent is extended or adjusted under 35 U.S.C. 154(b) by 563 days.

(21) Appl. No.: 11/258,469

(22) Filed: Oct. 24, 2005

(65) Prior Publication Data

US 2007/0093033 A1    Apr. 26, 2007

(51) Int. Cl.
*H01L 21/8242* (2006.01)
*H01L 21/336* (2006.01)
*H01L 21/20* (2006.01)

(52) U.S. Cl. .................. 438/303; 438/249; 438/392; 438/358; 438/369; 257/E21.211; 257/E21.466; 257/E21.468

(58) Field of Classification Search .................. 438/285, 438/300, 561, 564, 530, 518
See application file for complete search history.

(56) References Cited

U.S. PATENT DOCUMENTS

| 2001/0039094 A1* | 11/2001 | Wristers et al. ............. 438/305 |
| 2004/0072446 A1* | 4/2004 | Liu et al. ..................... 438/719 |
| 2005/0093075 A1* | 5/2005 | Bentum et al. ............... 257/368 |

* cited by examiner

*Primary Examiner*—Ha Tran T Nguyen
*Assistant Examiner*—Valerie Brown
(74) *Attorney, Agent, or Firm*—Tung & Associates

(57) ABSTRACT

An ultra shallow junction (USJ) FET device and method for forming the same with improved control over SDE or LDD doped region interfaces to improve device performance and reliability is provided, the method including providing a semiconductor substrate; forming a gate structure comprising a gate dielectric, an overlying gate electrode, and first offset spacers adjacent either side of the gate electrode; forming at least one doped semiconductor layer comprising dopants over a respective source and drain region adjacent the respective first offset spacers; forming second offset spacers adjacent the respective first offset spacers; and, thermally treating the at least one semiconductor layer to cause out-diffusion of the dopants to form doped regions in the semiconductor substrate.

29 Claims, 3 Drawing Sheets

ULTRA SHALLOW JUNCTION FORMATION BY SOLID PHASE DIFFUSION

FIELD OF THE INVENTION

This invention generally relates to MOSFET semiconductor devices and methods for forming the same and more particularly to a MOSFET device and method for forming the same including ultra-shallow junction (USJ) formation by solid phase diffusion (SPD) to reduce short channel effects (SCE) such as drain to gate overlap capacitance and current (diode) leakage characteristics for deep-submicron MOSFET semiconductor devices.

BACKGROUND OF THE INVENTION

In the integrated circuit industry today, hundreds of thousands of semiconductor devices are built on a single chip. As the size of CMOS transistors, also referred to as MOSFETs, are scaled down, one of the most important challenges facing a device designer are short channel effects (SCE) in reduced gate length devices. For example, short channel effects that influence the electrical operating characteristics of FET devices include $V_T$ rolloff, drain induced barrier lowering (DIBL), subthreshold swing degradation, gate to drain overlap capacitance and current (diode) leakage characteristics. Short channel effects (SCE) are a function of several processing effects including width and depth of S/D regions and S/D region dopant concentration.

For example, since SCE is related to the junction depth (xj), shallower junction depths can improve device operating characteristics. However, an off-setting consideration as junction depths decrease is the increase in the S/D parasitic resistance which has several components including the resistance of the source/drain extension (SDE) region and the resistance of conductive portions over the source/drain regions. As the junction depth decreases to reduce SCE, increased dopant concentrations are required to offset an increase in parasitic resistance to avoid degradation of device performance.

To overcome some of the short channel effects (SCE) as device sizes are scaled down, including leakage current (diode leakage), proposed solutions have included providing raised S/D regions by raising up the S/D contact surface by selective epitaxial silicon growth (SEG) over the S/D contact regions. While diode leakage has been shown to be reduced by this process, other shortcomings remain, including achieving shallower junction depths while preserving low S/D and SDE resistances. For example, gate to drain overlap capacitance is strongly affected by lateral diffusion of the doped S/D and SDE regions, which is increasingly difficult to control by conventional ion implantation and thermal diffusion processes. For example, carrying out a process to form raised S/D structures following doping of the S/D regions contributes an additional thermal process which can undesirably increase the lateral diffusion thereby increasing gate to drain overlap capacitance and degrading device performance.

In addition, ion implantation to form ultra-shallow junctions, for example less than about 300 Angstroms, is increasingly difficult to control. For example higher dopant implant concentrations are required to avoid an increase in parasitic resistances at shallower junction depths. While reducing the ion implant energy may result in shallower junctions, the higher required dopant concentration required contributes to significant semiconductor substrate damage including forming amorphous or disordered lattice regions.

Consequently, in the thermal activation process, or in subsequent thermal processes carried out following ion implantation and activation, localized ion implanted damaged regions experience higher dopant diffusion rates, leading to poorly defined dopant region interfaces, which contributes to both increased junction depths and increased lateral diffusion into the channel region below the gate. As a result, SCE effects are increased, including increased gate to drain overlap capacitance and current leakage thereby degrading device performance and reliability.

There is therefore a continuing need in the MOSFET device design and processing art to develop new device designs and processing methods for forming MOSFET devices to achieved reduced short channel effects (SCE) while avoiding degradation of device performance and reliability.

It is therefore among the objects of the present invention to provide an improved MOSFET device and a process for forming the same to achieved reduced short channel effects (SCE) while avoiding degradation of device performance and reliability, in addition to overcoming other shortcomings of the prior art.

SUMMARY OF THE INVENTION

To achieve the foregoing and other objects, and in accordance with the purposes of the present invention, as embodied and broadly described herein, an ultra shallow junction (USJ) FET device and method for forming the same with improved control over SDE or LDD doped region interfaces to improve device performance and reliability is provided.

In a first embodiment, the method includes, providing a semiconductor substrate; forming a gate structure comprising a gate dielectric, an overlying gate electrode, and first offset spacers adjacent either side of the gate electrode; forming at least one doped semiconductor layer comprising dopants over a respective source and drain region adjacent the respective first offset spacers; forming second offset spacers adjacent the respective first offset spacers; and, thermally treating the at least one semiconductor layer to cause out-diffusion of the dopants to form doped regions in the semiconductor substrate.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to exemplary processing steps for forming ultra-shallow junction (USJ), deep submicron technology MOSFET devices having a junction depth of less than about 200 Angstroms. It will be appreciated that the method may be used with larger device technologies, but that it is most advantageously used with deep sub-micron design rule technologies (e.g., <60 nm), for example where a junction depth is from about 50 to about 200 Angstroms.

Figure 1A:
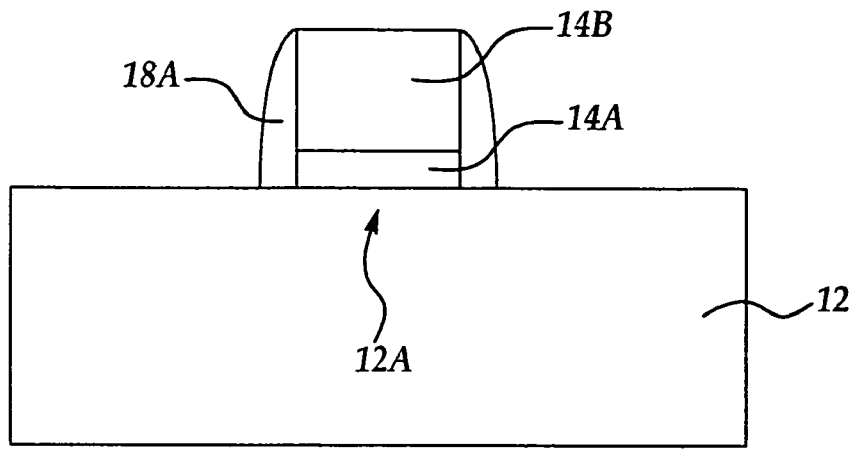
FIGS. 1A-1E are cross sectional schematic views of an exemplary MOSFET device at stages in manufacture according to an embodiment of the present invention.
Figure 1B:
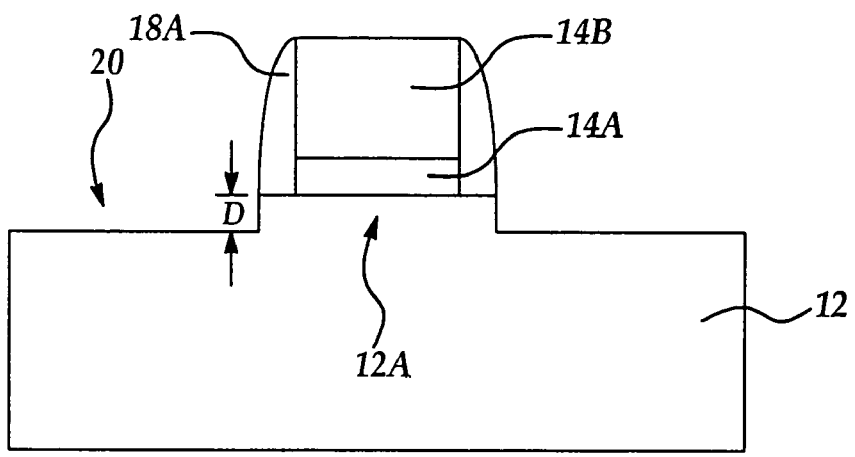

In an exemplary embodiment of the present invention, reference is made to FIGS. 1A-1E where cross sectional schematic views are shown of an exemplary MOSFET device in stages of manufacture according to embodiments of the present invention. For example, referring to FIG. 1A, is shown a semiconductor substrate 12, which may include silicon, strained semiconductor, compound semiconductor, and multi-layered semiconductors, or combinations thereof. For example, the substrate 12 may include, but is not limited to, silicon on insulator (SOI), stacked SOI (SSOI), stacked SiGe on insulator (S—SiGeOI), SiGeOI, and GeOI, or combinations thereof.

Still referring to FIG. 1A, an exemplary FET device is formed over the substrate 12 including a gate structure formed over an active channel region 12A including a gate dielectric 14A, gate electrode 14B, and including offset spacers e.g., 18A, adjacent either side of the gate structure.

Still referring to FIG. 1A, gate structures including a gate dielectric 14A and gate electrode 14B may be formed by conventional CVD deposition, lithographic patterning, and plasma and/or wet etching methods known in the art. The gate dielectric portion e.g., 14A may be formed by any process known in the art, e.g., thermal oxidation, nitridation, sputter deposition, or chemical vapor deposition. The physical thickness of the gate dielectric may vary depending on dielectric constant of the gate dielectric, but is preferably from about 20 Angstroms to about 100 Angstroms and preferably has an equivalent oxide (silicon oxide) thickness (EOT) of less than about 17 Angstroms. The gate dielectric may be formed of silicon oxide, silicon nitride, silicon oxynitride, a high-K (high permittivity) dielectric, or combinations thereof including a multi-layered gate dielectric. When using a high permittivity (high-K) dielectric, preferably the dielectric constant is greater than about 3.9, more preferably greater than about 8.0. The high-K dielectric may include transition metal oxides and rare earth oxides, for example including aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

The gate electrode e.g., 14B may be formed of polysilicon, amorphous polysilicon, polysilicon-germanium, metals, metal silicides, metal nitrides, metal oxides, or combinations thereof. In a preferred embodiment, the gate electrode is formed of doped polysilicon. Metals such as molybdenum, tungsten, titanium, tantalum, platinum, and hafnium may be used in an upper portion of the gate electrode e.g., 14B. Metal nitrides may include, but are not limited to, molybdenum nitride, tungsten nitride, titanium nitride, and tantalum nitride. Conductive metal oxides may include, but are not limited to, ruthenium oxide and indium tin oxide.

The gate electrode 14B material may be deposited by conventional techniques such as CVD methods. A patterned gate hardmask is then formed on the gate electrode material using conventional deposition and photolithographic techniques. The gate hardmask may employ commonly used masking materials such as, but not limited to, silicon oxide, silicon oxynitride, and silicon nitride. The gate material is then etched according to the gate hardmask using a plasma etch process to form the gate electrode, e.g., 14B. It will be appreciated that other methods of forming a gate structure may be employed. For example, a damascene method may be employed where an opening is etched in an oxide layer overlying a semiconductor substrate, followed by forming a liner and a gate dielectric in the bottom portion of the opening, followed by backfilling with a gate electrode material, followed by removing the oxide layer to leave a free-standing gate structure.

Still referring to FIG. 1A, a first set of offset spacers e.g., 18A, also referred to as sidewall spacers, are formed adjacent the outer edges (sidewalls) of the gate electrode 14B by first depositing one or more offset dielectric layers of silicon nitride and/or silicon oxynitride. For example, an LPCVD or PECVD process may be used and/or a thermal or plasma growth process over polysilicon, e.g. nitride or oxynitride growth over polysilicon. The offset spacers e.g., 18A are preferably and importantly, formed of silicon oxynitride and/or silicon nitride including multiple layers to prevent subsequent dopant diffusion into the offset spacers as discussed further below. For example, the offset spacers may be formed by first depositing dielectric layers followed by etching away portions of the dielectric layers to form offset spacers e.g., 18A on either side of the gate electrode 14B and on opposing sides of the channel region 12A. Preferably each of the first set of offset spacers has a maximum width of less than about 200 Angstroms. In an important aspect of the invention, an LDD or source/drain extension (SDE) ion implant process is not carried out prior to forming the first set of offset spacers e.g., 18A Referring to FIG. 1B, following formation of the first set of offset spacers e.g., 18A, source/drain (S/D) recessed regions e.g., 20 are formed adjacent the offset spacers extending a depth D, into the semiconductor substrate 12 on opposing sides of the channel region 12A. Conventional dry or wet etching processes, including a wet or dry semiconductor substrate oxidation process followed by a wet or dry etching process to remove the oxidized portions may be used to form the S/D recessed regions e.g., 20, preferably having a depth, D of less than about 400 Angstroms.

Figure 1C:
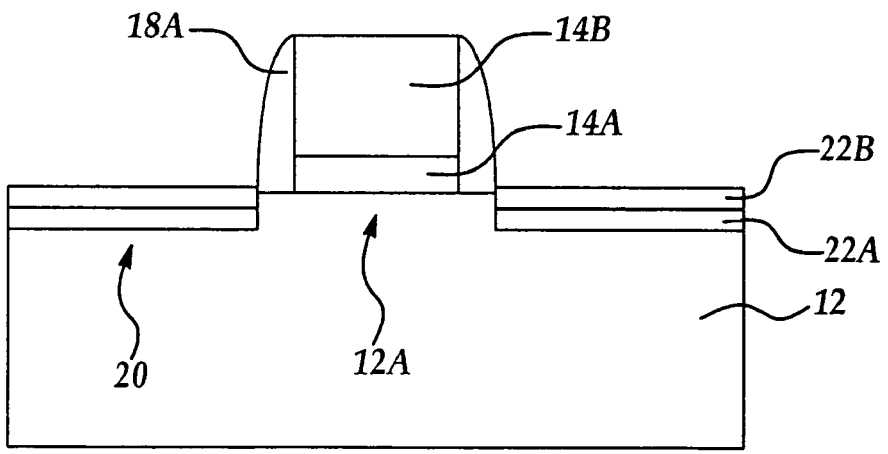

Referring to FIG. 1C, at least two semiconductor material layers are sequentially formed over the S/D recessed regions e.g., 20. In one embodiment, layer 22A is preferably epi-Si for reducing the roughness after the etching step to form S/D recessed regions, since the overlying layer 22B, preferably epi-SiGe, is sensitive to the roughness. In addition, the preferred bi-layer of semiconductor materials, e.g., epi-Si 22A and epi-SiGe 22B improve control of an LDD doping profile. Preferably, the semiconductor material layers 22A and 22B have a high solid phase solubility for dopants. The semiconductor layers 22A and 22B are preferably formed by conventional epitaxial growth process, including in-situ doping, to form a doped semiconductor or compound semiconductor layers. For example in one embodiment, the layers including the uppermost layer 22B is formed of $Si_{1-\alpha}Ge_\alpha$, carbon doped SiGe, $Si_{i-\alpha}C_\alpha$ or Ge doped SIC, or combinations thereof. In addition, N or P type dopants may be deposited in the semiconductor layers 22A and/or 22B during the epitaxial growth process, for example using conventional dopants such as boron (B), phosphorous (P), or arsenic (As) as is known in the art to achieve a selected dopant concentration in addition to a subsequent ion implantation process discussed below. The semiconductor dopants e.g., carbon or Ge, as well as N or P type dopants may be added uniformly throughout the semiconductor layers and/or may form a dopant gradient within the layers 22A and 22B. Preferably the semiconductor layers 22A and 22B are formed of different materials. For example, the semiconductor layers 22A and 22B may be formed of polysilicon, amorphous polysilicon, silicon, silicon-germanium (e.g., SiGe), silicon-germanium doped with carbon (e.g., SiGe(C), silicon carbide (e.g., SiC), or any combination thereof. Most preferably, the uppermost semiconductor layer 22B includes silicon-germanium (SiGe) containing formulations or silicon-carbide (SiC) containing formulations due to higher solids solubility.

Figure 1D:
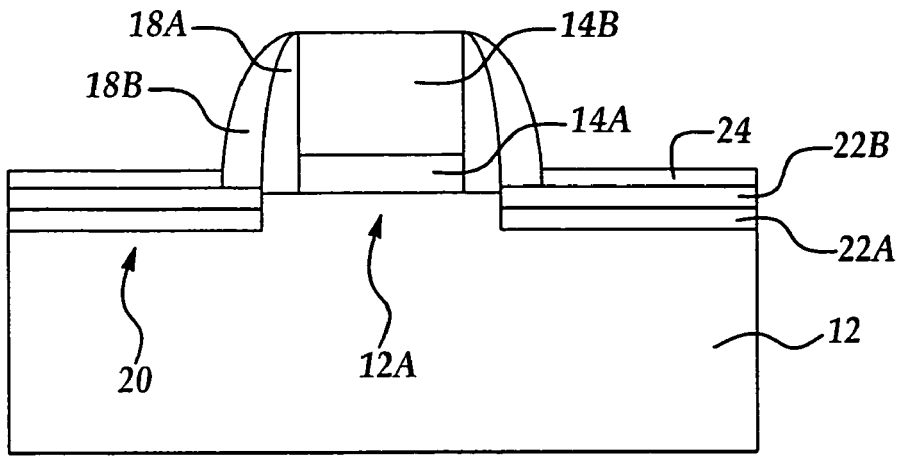

Referring to FIG. 1D, a second pair of offset spacers e.g., 18B is then formed over the first pair of offset spacers e.g., 18A in the same manner and with the same preferred materials as previously specified for the first set, of spacers e.g., 18A. Importantly, the second set (pair) of spacers e.g., 18B is formed of silicon oxynitride and/or silicon nitride as in the first set of offset spacers e.g., 18A, to prevent dopant diffusion into the spacers as explained further below.

Still referring to FIG. 1D, following formation of the second set of offset spacers, a layer of silicon 24 is then epitaxially deposited over the uppermost semiconductor layer 22B. While the thickness of the semiconductor layers 22A and 22B may vary depending on the material, dopant solubility, and desired implant depth of a subsequent ion implant process, the semiconductor layers. 22A and 22B may range from about 50 Angstroms to about 400 Angstroms in thickness, and the silicon layer 24 may range from about 50 Angstroms to about 200 Angstroms in thickness.

Figure 1E:
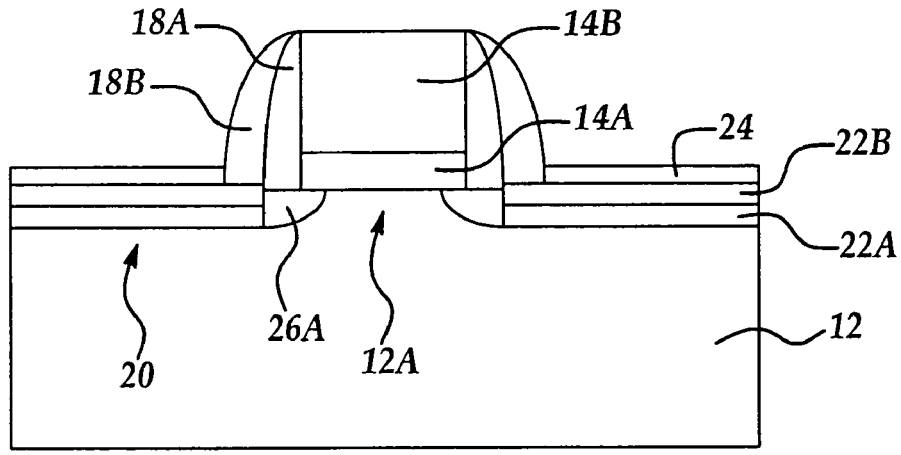

Referring to FIG. 1E, following formation of the silicon layer 24, a conventional high dose ion implantation (HDI) process is carried out to at least implant ions over the S/D regions adjacent the second set of offset spacers e.g., 18B. Preferably, the ion implant process achieves an N or P type dopant concentration e.g., B, P, or As, of from about $10^{20}$ to about $10^{21}$ dopant atoms/cm$^3$. Following the HDI process, a conventional rapid thermal anneal (RTA) is carried out to cause solid state diffusion of the dopants from semiconductor layer 22A and 22B to form SDE regions e.g., 26A laterally diffused below the gate dielectric e.g., 14A preferably having a junction depth from about 50 Angstroms to about 200 Angstroms.

Figure 2:
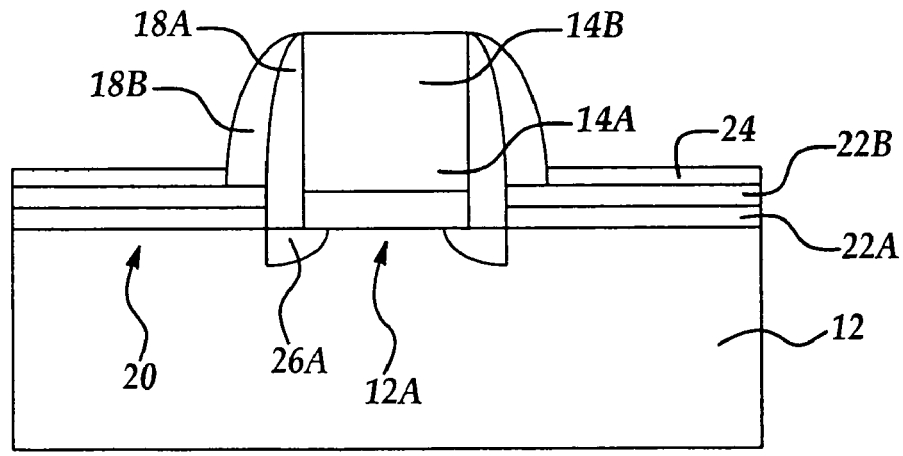
FIG. 2 is a cross sectional schematic view of another embodiment of an exemplary MOSFET device according to the present invention.

Referring to FIG. 2, is shown an alternative embodiment of the present invention, the same Figure numerals representing the same structures discussed with respect to FIGS. 1A-1E. In this embodiment, the process for formation is the same as the embodiments shown in FIGS. 1A through 1E except that recessed regions e.g., 20 over the S/D regions are not formed, the present embodiment thereby forming raised source/drain regions following semiconductor layer 22A and 22B and silicon layer 24 formation.

Thus, according to the present invention, an FET device and method for forming the same to achieve ultra shallow junctions with increased doping concentration and control over lateral diffusion has been presented. Advantageously, the SDE regions e.g., 26A are formed with a superior lateral abruptness, thereby improving short channel effects. In addition, advantageously, the SDE regions are formed with a dopant concentration of between about $10^{20}$ to about $10^{21}$ dopant atoms/cm$^3$ thereby avoiding increased parasitic electrical resistances and enhancing drive current.

For example, by using the preferred materials to carry out the solid phase diffusion process to form SDE regions following selective epitaxial growth (SEG) of semiconductor material layers over the S/D regions, undesired anomalous diffusion in semiconductor substrate material damaged by ion implantation processes is avoided. In addition superior control over the definition of interface portions of the SDE is achieved allowing formation of shallow, well defined junctions, with sufficient doping to lower an electrical resistance. Thus, the depth of the SDE regions are formed with reduced electrical resistances at shallower depths with decreased undesired lateral diffusion compared to prior art processes. Advantageously, drive currents and device signal speeds are enhanced, as well as improving other aspects of device performance and improving device reliability.

Figure 3:
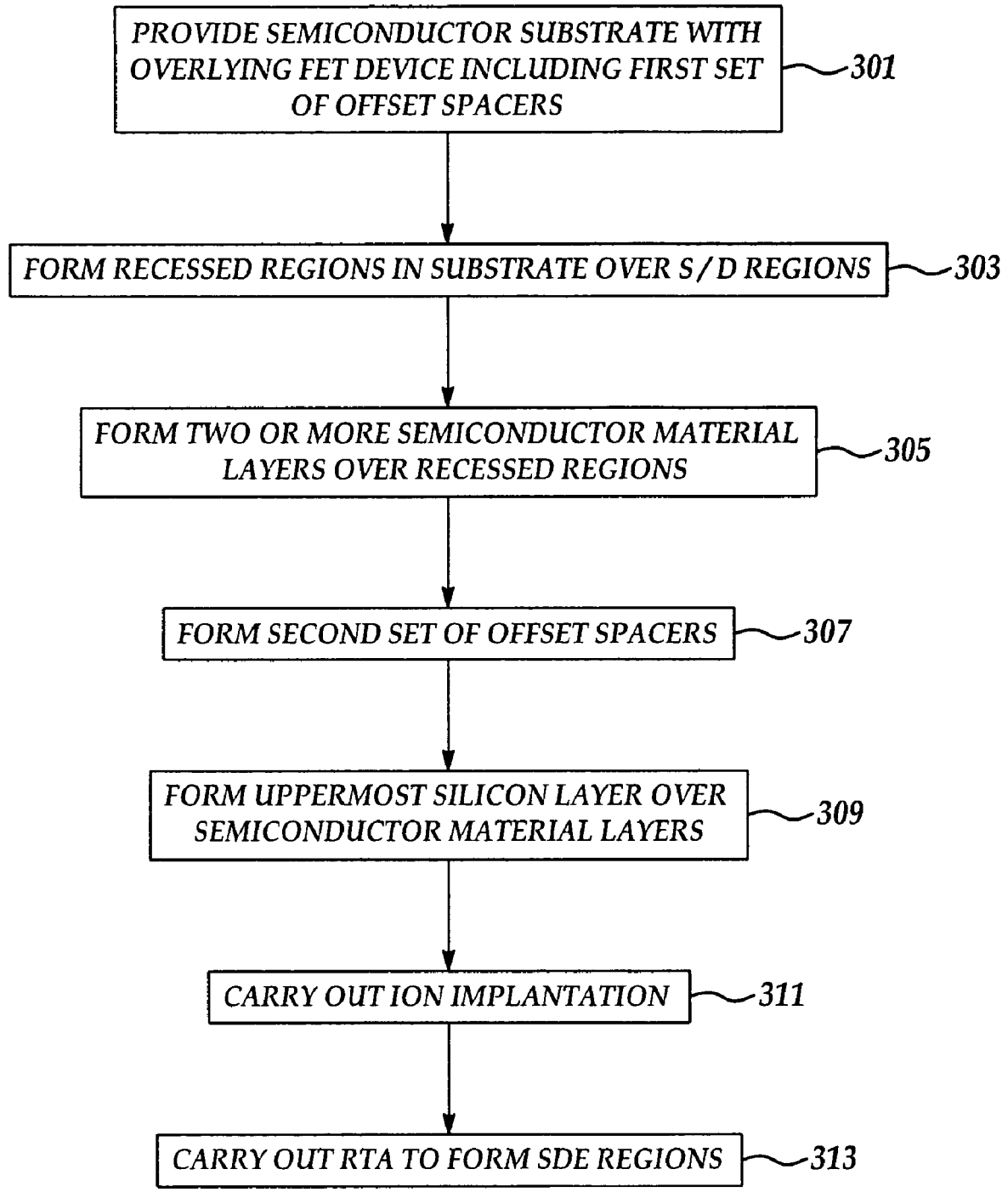
FIG. 3 is a process flow diagram including several embodiments of the present invention.

Referring to FIG. 3 is a process flow diagram including several embodiments of the present invention. In process 301, a semiconductor substrate is provided including an overlying gate structure (e.g., FET) and first set of offset spacers. In process 303, optionally, but preferably, recessed regions are formed over the S/D regions on either side of a channel region. In process 305 at least two stacked semiconductor material layers are formed over the recessed regions according to preferred embodiments. In process 307, a second set of offset spacers is formed adjacent the first set and contacting the uppermost semiconductor material layer. In process 309, an uppermost silicon layer is formed over the semiconductor material layers. In process 311, an ion implantation process is carried out implant dopants including the at least one of the two semiconductor layers. In process 313, an RTA process is carried out to out-diffuse the dopants to form an ultra shallow junction region (SDE region).

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming ultra-shallow junctions in an FET device comprising the steps of:
   providing a semiconductor substrate;
   forming a gate structure comprising a gate dielectric, an overlying gate electrode, and first offset spacers adjacent either side of the gate electrode;
   forming at least one doped semiconductor layer comprising dopants over a respective source and drain region adjacent the respective first offset spacers;
   forming second offset spacers adjacent the respective first offset spacers following forming the at least one doped semiconductor layer, said first and second offset spacers comprising said FET device; and,
   thermally treating with said first and second offset spacers in place the at least one doped semiconductor layer to cause out-diffusion of the dopants to form doped regions in the semiconductor substrate.

2. The method of claim 1, wherein the at least one doped semiconductor layer is formed by a method selected from the group consisting of in-situ doping and ion implantation.

3. The method of claim 1, wherein the at least one doped semiconductor layer is formed by ion implanting at least one of N-type and P-type dopants.

4. The method of claim 1, wherein a silicon layer is formed over the at least one doped semiconductor layer following formation of second offset spacers.

5. The method of claim 1, further comprising forming recessed regions comprising the respective source and drain regions extending a depth into the semiconductor substrate prior to step of forming the at least one doped semiconductor layer.

6. The method of claim 5, wherein the depth is less than about 400 Angstroms.

7. The method of claim 1, wherein the thickness of the at least one doped semiconductor layer is less than about 400 Angstroms.

8. The method of claim 1, wherein the at least one doped semiconductor layer comprises a material selected from the group consisting of polysilicon, amorphous polysilicon, silicon, silicon-germanium, carbon doped silicon-germanium, silicon carbide, and combinations thereof.

9. The method of claim 1, wherein the at least one doped semiconductor layer comprises a lowermost epitaxial silicon layer.

10. The method of claim 1, wherein the step of forming the at least one doped semiconductor layer comprises an in-situ doping epitaxial deposition process.

11. The method of claim 10, wherein a doping gradient is formed.

12. The method of claim 1, wherein the first and second offset spacers comprise a dielectric material selected from the group consisting of silicon nitride and silicon oxynitride.

13. The method of claim 1, wherein the thermal treatment comprises a rapid thermal anneal (RTA) process.

14. The method of claim 1, wherein the doped regions comprise doped regions selected from the group consisting of source and drain extension (SDE) regions and lightly doped drain (LDD) regions.

15. The method of claim 1, wherein the doped regions have a maximum depth of from about 50 Angstroms to about 200 Angstroms with a dopant concentration of from about $10^{20}$ to $10^{21}$ dopant atoms/cm$^3$.

16. A method for forming ultra-shallow junctions in an FET device comprising the steps of:
providing a semiconductor substrate;
forming a gate structure comprising a gate dielectric, an overlying gate electrode, and first offset spacers adjacent either side of the gate electrode;
forming at least one doped semiconductor layer comprising dopants over a respective source and drain region adjacent the respective first offset spacers;
forming second offset spacers adjacent the respective first offset spacers following forming the at least one doped semiconductor layer, said first and second offset spacers comprising said FET device;
forming a silicon layer over the at least one doped semiconductor layer following formation of second offset spacers; and,
thermally treating with said first and second offset spacers in place the at least one doped semiconductor layer to cause out diffusion of the dopants to form doped regions in the semiconductor substrate.

17. The method of claim 16, further comprising forming recessed regions comprising the respective source and drain region extending a depth into the semiconductor substrate prior to step of forming the at least one doped semiconductor layer.

18. The method of claim 17, wherein the depth is less than about 400 Angstroms.

19. The method of claim 16, wherein the at least one doped semiconductor layer is formed by a method selected from the group consisting of in-situ doping and ion implantation.

20. The method of claim 16, wherein the at least one doped semiconductor layer is formed by ion implanting at least one of N-type and P-type dopants.

21. The method of claim 16, wherein the thickness of the at least one doped semiconductor layer is less than about 400 Angstroms.

22. The method of claim 16, wherein the at least one doped semiconductor layer comprises a material selected from the group consisting of polysilicon, amorphous polysilicon, silicon, silicon-germanium, carbon doped silicon-germanium, silicon carbide, and combinations thereof.

23. The method of claim 16, wherein the at least one doped semiconductor layer comprises a lowermost epitaxial silicon layer.

24. The method of claim 16, wherein the step of forming the at least one doped semiconductor layer comprises an in-situ doping epitaxial deposition process.

25. The method of claim 24, wherein a doping gradient is formed in the doped semiconductor layer.

26. The method of claim 16, wherein the first and second offset spacers comprise a dielectric material selected from the group consisting of silicon nitride and silicon oxynitride.

27. The method of claim 16, wherein the doped regions have a maximum depth of from about 50 Angstroms to about 200 Angstroms with a dopant concentration of from about $10^{20}$ to $10^{21}$ dopant atoms/cm$^3$.

28. The method of claim 1, wherein said doped regions comprise dopants only from said out-diffusion of the dopants.

29. The method of claim 16, wherein said doped regions comprise dopants only from said out-diffusion of the dopants.

* * * * *